Figure 1:
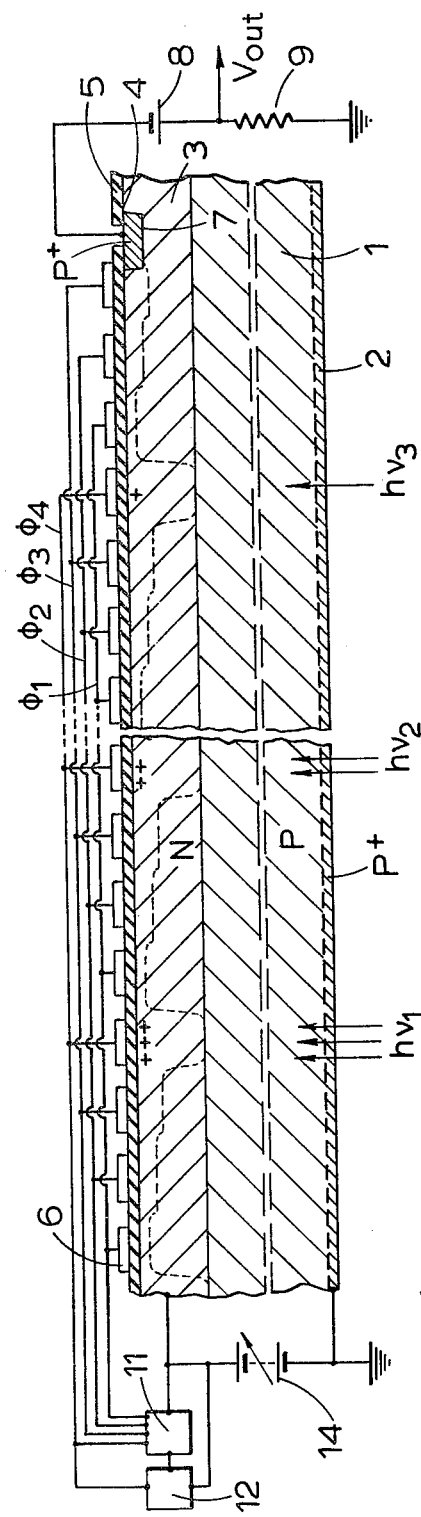

United States Patent [19]

Shannon

[11] 4,258,376

[45] Mar. 24, 1981

[54] CHARGE COUPLED CIRCUIT ARRANGEMENT USING A PUNCH-THROUGH CHARGE INTRODUCTION EFFECT

[75] Inventor: John M. Shannon, Whyteleafe, England

[73] Assignee: U.S. Philips Corporation, New York, N.Y.

[21] Appl. No.: 965,112

[22] Filed: Nov. 30, 1978

Related U.S. Application Data

[63] Continuation of Ser. No. 781,331, Mar. 25, 1977, abandoned.

[30] Foreign Application Priority Data

Mar. 30, 1976 [GB] United Kingdom ............... 12717/76

[51] Int. Cl.³ .................... H01L 29/78; H01L 27/14; H01L 31/00
[52] U.S. Cl. ........................................ 357/24; 357/16; 357/30; 357/61; 357/63; 307/221 D; 250/338; 250/370
[58] Field of Search ............................. 357/24, 30, 16; 250/211 J, 338, 370; 781/331; 307/221 D

[56] References Cited

U.S. PATENT DOCUMENTS

| | | | |
|---|---|---|---|
| 3,792,465 | 2/1974 | Collins et al. | 357/24 |
| 3,852,801 | 12/1974 | Itoh et al. | 357/24 |
| 3,864,722 | 2/1975 | Carnes | 357/24 |
| 3,896,485 | 7/1975 | Early | 357/24 |
| 3,973,136 | 8/1976 | Lee | 357/24 |
| 4,142,198 | 2/1979 | Finnila et al. | 357/24 |

OTHER PUBLICATIONS

Barbe "Solid State Infrared Imaging", NATO Advanced Study Institute, Louvain-La-Neuve, Belgium (9/75), Published in Jespers et al., Eds., Solid State Imaging, Noordhoff, Leyden, Netherlands (1976), pp. 673-687.

*Primary Examiner*—Gene M. Munson
*Attorney, Agent, or Firm*—Thomas A. Briody; Robert T. Mayer; Steven R. Biren

[57] ABSTRACT

A charge coupled circuit arrangement uses a punch-through charge introduction effect to convert electromagnetic radiation into electrical signals. The invention is particularly, but not exclusively, adapted to convert electromagnetic radiation in the infra-red wavelength band into electrical signals. A charge coupled device using the punch-through charge introduction effect is also disclosed.

15 Claims, 4 Drawing Figures

4,258,376

CHARGE COUPLED CIRCUIT ARRANGEMENT USING A PUNCH-THROUGH CHARGE INTRODUCTION EFFECT

This is a continuation of application Ser. No. 781,331, filed Mar. 25, 1977, now abandoned.

This invention relates to charge coupled circuit arrangements and to charge coupled devices suitable for use in such circuit arrangements.

In our co-pending British patent application No. 36701/75, which corresponds to U.S. application No. 900,910, which is a continuation of Ser. No. 718,885, now abandoned, there is described and claimed a charge coupled circuit arrangement comprising a charge coupled device (CCD) having a semiconductor body comprising a region of one conductivity type in which charge carriers can be stored and transported, and means for converting signal information into an input of charge carriers into a storage site in said region by the punch-through of a depletion region positionally associated with said storage site to a rectifying barrier bounding a further region in the body forming a source of said charge carriers. In such an arrangement introduction of charge into a storage site can be obtained with good linearity and low signal input noise sensitivity by using punch-through of a depletion region associated with an input storage site to a rectifying barrier bounding a region in the semiconductor body separated from the CCD channel and forming a source of charge carriers to be stored and transported. The specification describes various arrangements both for surface channel CCD's and bulk channel CCD's. Various configurations of surface channel CCD devices are described in which the source region is a region of the opposite conductivity type and may consist, for example, of a substrate of the opposite conductivity type on which the layer of the one conductivity type is present. There is also described that in one such surface channel device a plurality of input gate electrodes are present at spaced positions of a part of the layer of the one conductivity type and each separated from the semiconductor layer by a barrier layer.

The present invention concerns the adaptation of the described punch-through charge introduction effect for converting an electromagnetic radiation pattern in a certain wavelength band, particularly but not exclusively an infra-red radiation pattern, into electrical signals.

For detecting and/or imaging of an infra-red radiation pattern, charge coupled devices have been proposed in various different forms. In one so-called 'hybrid' form the functions of detection and signal processing are performed in separate but integratable components by an array of infra-red detector elements individually connected to a silicon CCD shift register. The function of the CCD in this case is that of a signal processor performing appropriate functions. In other, so-called 'monolithic' forms the functions of detection and signal processing are performed in the same part of the semiconductor body. In one proposed form of 'monolithic' CCD for infra-red detection and/or imaging the operation and structure is essentially similar to that of a silicon surface channel CCD and is based on the generation of depletion regions adjacent the semiconductor surface where photogenerated minority charge carriers are collected. The device differs from conventional silicon imaging CCD's in respect of the material of the semiconductor layer. This material has to be chosen so that the absorption peak is in the infra-red region, the band gap of the semiconductor material being less than the energy of the infra-red photons. Therefore the material is restricted to certain narrow band gap semiconductors among the binary and ternary III–V, II–VI and IV–VI compounds. This to a certain extent is disadvantageous because the materials and processing technology is not so well developed as in silicon.

It has also been proposed to form a self-scanned infra-red imager/detector based upon the accumulation mode of operation of a CCD obtained by a biasing of an MIS structure which gives the same majority carrier type at the semiconductor surface as in the semiconductor bulk, it being a necessary condition for device operation that the density of majority carriers in the semiconductor be small enough to provide a surface charge density of majority carriers small enough to be manipulated by the charge transfer concept as used in conventional CCD's. Major disadvantages with such a structure are that in operation a large variation in the applied clocking voltages is required to get sufficient surface potential swings, and charge carriers representative of pattern information are transported through areas where there are many trapping centers. Furthermore unless the period for reading out the information is very short compared to the total frame time the image will become smeared due to the further collection of charge carriers during the read-out time.

According to one aspect of the invention a charge coupled circuit arrangement for converting an electromagnetic radiation pattern in a certain wavelength band into electrical signals comprises a body having a first layer-shaped part of semiconductor material having a charge transfer register for transferring in the first layer-shaped part charge carriers representative of pattern information, an adjoining, second layer-shaped part contiguous with said first layer-shaped part and comprising a photosensitive semiconductor material capable of yielding free charge carriers when subjected to radiation within said wavelength band, and circuit means connected to the device including means to cause locally at positions associated with storage sites in the first layer-shaped part the punch-through to the second layer-shaped part of a depletion region formed in the first layer-shaped part thereby enabling the direction introduction of radiation generated free charge carriers characteristic of a single conductivity type from the second layer-shaped part into the said storage sites in the first layer-shaped part, said storage sites being associated with the charge transfer register.

This arrangement enables the detection and/or imaging of radiaton in a certain wavelength band to be effected in a simple manner in a unitary semiconductor body structure with the direction introduction of packets of charge carriers representative of pattern information from the photosensitive, second layer-shaped part into storage sites in the first layer-shaped part and associated with the charge transfer register, the rate of supply of charge carriers being directly related to the instantaneous local intensity the incident radiation and thus being integrated during the period of the punch-through of the depletion region. The basis of the direct charge introduction which enables the forming in a simple manner of a compact and efficient device suitable for detecting and/or imaging, for example, infra-red radiation, is the provision of means to enable the local punch-through of a depletion region to the second layer-shaped part which effectively acts as charge carrier collection means. Thus it is possible to choose the materials of the first and second layer-shaped parts with a view to the particular functions they have to perform without the undue constraints in this respect as imposed in some of the described prior art devices. Effectively the punch-through mode of charge introduction enables the provision in a single body, for example in an arrangement for detecting and/or imaging an infra-red radiation pattern, of a photosensitive part of high performance and resolution and a charge transfer register based upon standard technology. As will be described hereinafter the photosensitive part may be of an extrinsic semiconductor material or an intrinsic photoconductive semiconductor material or an intrinsic photoconductive semiconductor material. The aforesaid advantages are particularly relevant in the latter case where in general hitherto intrinsic photoconductors have been found to yield a higher performance and resolution in the detection and/or imaging of infra-red radiation.

Reference herein to the introduction of radiation generated free charge carriers into storage sites associated with the charge transfer register is to be understood herein to include both the case of (a) introduction into storage sites which are directly associated with the charge transfer register in so far as said sites are defined by electrodes forming part of a transfer line via which a plurality of radiation generated charge packets are transferred to read-out means and (b) introduction into storage sites which are indirectly associated with the charge transfer register in so far as said sites are defined by electrodes, so-called storage gate electrodes, situated in close proximity to a transfer line via which radiation generated charge packets are transferred to read-out means following their individual transfer from the said storage sites.

A significant advantage of the punch-through mode of charge introduction resides in the capability of being able to control the period during which charge carriers are introduced into the storage sites in the first layer-shaped part. This property is particularly relevant in connection with the high photon flux which may be encountered when detecting and/or imaging infra-red radiaton. Furthermore the problem of image smearing can be substantially avoided.

In a first form of charge coupled arrangement in accordance with the invention the second layer-shaped part is of extrinsic semiconductor material of one conductivity type and at least the adjoining portion of the first layer-shaped part is of the opposite conductivity type, the second layer-shaped part comprising an impurity concentration capable of yielding at the temperature of operation impurity levels from which trapped charge carriers characteristic of said one conductivity type can be released upon excitation by radiation in the said wavelength band. See, for example, FIG. 1.

This form of the arrangement, although in many instances requiring cooling to a low temperature in order that the said impurity concentration shall yield levels for the capture of majority charge carriers and thereby enable the majority charge carriers to be released by radiation excitation, has the inherent advantageous feature that in contrast with certain prior art monolithic detectors comprising a charge transfer register and on which the operation is based on the normal generation of electron-hole pairs by absorption of radiation, it is no longer essentially necessary for the detection and/or imaging to employ a semiconductor material having an energy band gap which is less than the photon energy of the radiation to which the arrangement is destined to be sensitive. Furthermore the material of the first layer-shaped part can be chosen in order to yield the desired charge transfer action without constraints being imposed by the particular wavelength band of the radiation to which the arrangement is destined to be sensitive. Thus, for example, it is possible to employ a body comprising a silicon layer-shaped part in which a charge transfer register is present and an adjoining photosensitive layer of extrinsic silicon in which the detection and/or imaging is effected.

In one arrangement of the said one form the first layer-shaped part is of the opposite conductivity type and the charge transfer register is constructed for operation with charge transport of radiation excited free charge carriers characteristic of the one conductivity type introduced into storage sites in the first layer-shaped part via the local punch-through to the second layer-shaped part of depletion region parts extending across the thickness of the first layer-shaped part. In this manner the first layer-shaped part may comprise a substantially conventional surface adjoining channel charge coupled device and a compact and simple structure provided, for example by providing the charge coupled device in an epitaxial silicon layer of the opposite conductivity type present on an extrinsic silicon substrate of the one conductivity type, as shown, for example, in FIG. 1.

In another arrangement of the said one form the first layer-shaped part comprises a region of the one conductivity type which is separated from the second layer-shaped part by a region of the opposite conductivity type, a rectifying junction being present between said regions of the one conductivity type and the opposite conductivity type, the charge transfer register being constructed for operation with charge transport of radiation excited free charge carriers characteristic of the one conductivity type via the bulk of the region of the one conductivity type and introduced into storage sites in the region of the one conductivity type via the local punch-through to the second layer-shaped part of a depleton region associated with said rectifying junction between the regions of the one and the opposite conductivity type. See, for example, FIG. 4. In this manner the first layer-shaped part may comprise a substantially conventional, so-called 'bulk channel' charge coupled device and the known advantages inherent in using such a charge coupled device derived. Thus, for example, the body may comprise a double epitaxial silicon layer structure present on an extrinsic silicon substrate of the one conductivity type, means being present for isolating from the surroundings, at least during operation, the region of the one conductivity type formed in the upper epitaxial layer.

In any of the said arrangements of the said one form and in which both the first layer-shaped part and the second layer-shaped part are of silicon various possibilities exist for the impurity concentration in the second layer-shaped part which provides the levels for trapping majority charge carriers which can be released by radiation excitation and furthermore various possibilities exist for the dimensions of the layer. For high responsivity one desires to obtain a total of approximately $10^{16}$ impurity centers per sq. cm. taken over the thickness of the second layer-shaped part, the particular value depending upon the optical cross-section of the impurity center. Thus the possibility exists of choosing a body part which lies somewhere between the extreme cases of a relatively lightly doped layer-shaped part of large thickness and a relatively highly doped layer-shaped part of small thickness. However the required temperature to achieve the desired operation is also a relevant factor as, although within the scope of the invention there is included the case of an impurity concentration providing the trapping levels being a conventional donor or acceptor in a second layer-shaped part of n-type or p-type silicon respectively, the use of such impurities may require cooling to very low temperatures before they become un-ionized. Thus it may be preferred to employ other less commonly used impurities in order that higher operating temperatures may be employed and furthermore to provide them in a concentration approaching the solid solubility limit in order to optimize the resolution. With many of these impurities, for example when using silicon, the solid solubility limit will be lower than that of the conventionally used impurities and this will necessitate the use of thicker layers in order to achieve the desired absorption. Thus, for example when using thallium as the impurity in a p-type silicon layer and of which the solubility limit therein is approximately $2 \times 10^{17}$ impurity atoms per $cm^3$ it will be desirable for achieving resonable sensitivity to infra-red radiation in the wavelength band of 3 microns to 5 microns to use a second layer-shaped part of several hundred microns thickness. However the use of layers of relatively large thickness will be detrimental to the resolution. Another possibility for the impurity concentration when using p-type silicon for the second layer-shaped part is indium. Hence in a preferred form of an arrangement of the said one form and in which both the first layer-shaped part and the second layer-shaped part are of silicon, the second layer-shaped part is of p-type silicon, the said impurity concentration comprises at least one of the elements indium and thallium and provides a sensitivity to infra-red radiation in the wavelength band of between 3 microns and 5 microns. This arrangement may necessitate operation at 60° K. for detection and/or imaging of infra-red radiation in said wavelength band.

In another preferred form of such an arrangement of the said one form and in which both the first layer-shaped part and the second layer-shaped part are of silicon, the second layer-shaped part is of p-type silicon, the said impurity concentration comprises gallium and provides a sensitivity to infra-red radiation in the wavelength band of between 8 microns and 14 microns. This arrangement may necessitate operation at 30° K. for detection and/or imaging of infra-red radiation in said wavelength band.

According to a further aspect of the invention a charge coupled device suitable for use in an arrangement in accordance with the invention comprises a body having a first layer-shaped part of semiconductor material having a charge transfer register and an adjoining second layer-shaped part which is contiguous with said first layer-shaped part and is of extrinsic semiconductor material of one conductivity type comprising an impurity concentration capable of yielding impurity levels from which trapped charge carriers characteristic of said one conductivity type can be released upon excitation by radiation in a certain wavelength band, the charge transfer register comprising a system of electrodes present adjacent the surface of the first layer-shaped part opposite and remote from the second layer-shaped part and provided for enabling transfer in the longitudinal direction of the first layer-shaped part of charge carriers characteristic of said one conductivity type following their direct introduction from the second layer-shaped part into storage sites in the first layer-shaped part and associated with the charge transfer register, at least the portion of the first layer-shaped part adjoining the second layer-shaped part being of the opposite conductivity type and forming a rectifying junction with the second layer-shaped part, introduction into storage sites in the first layer-shaped part of free charge carriers characteristic of said one conductivity type released by radiation excitation in the second layer-shaped part being possible only via the said rectifying junction and by the local punch-through of a depletion region formed at least in the said portion of the first layer-shaped part of the opposite conductivity type. Such a device may be provided in a relatively simple manner and advantageously employed in the manner described.

In one form the first layer-shaped part is of the opposite conductivity type and the charge transfer register is constructed for operation with charge transport of radiation excited free charge carriers characteristic of the one conductivity type adjacent the said surface of the first layer-shaped part, the thickness and doping concentration of the first layer-shaped part being such as to enable local depletion region parts to be formed extending across the entire thickness of said part while avoiding breakdown.

In another form the first layer-shaped part comprises a region of the one conductivity type which is separated from the second layer-shaped part by a region of the opposite conductivity type, a rectifying junction being present between said regions of the one conductivity type and the opposite conductivity type, the charge transfer register being constructed for operation with charge transport of radiation excited free charge carriers characteristic of the one conductivity type via the bulk of the region of the one conductivity type, the thickness and doping concentration of the region of the one conductivity being such as to enable the region locally to be fully depleted while avoiding breakdown and the thickness and doping concentration of the region of the opposite conductivity type being such as to enable said region locally to be fully depleted while avoiding breakdown.

In a device in accordance with the said further aspect of the invention the first layer-shaped part and the second layer-shaped part both may be of silicon and the said impurity concentration present in the second layer-shaped part chosen with respect to the intended operation of the device as previously described with respect to the said first form of the arrangement in accordance with the invention.

In one preferred form of the device the first layer-shaped part is present as an epitaxial layer on a substrate body comprising the second layer-shaped part.

In a second form of a charge coupled arrangement in accordance with the invention the second layer-shaped part is of an intrinsic photoconductive semiconductor material having an energy band gap less than the photon energy of radiation within the said wavelength band and forming a heterojunction with the semiconductor material of the first layer-shaped part. See, for example, FIG. 3. An intrinsic photoconductive semiconductor material is to be understood to mean a semiconductor material in which hole/electron pairs can be generated by radiation in the said wavelength band by transitions across the forbidden band gap.

In this form the considerable advantage arises of being able to use an intrinsic photoconductor with its potentially higher resolution in combination in a single body with a charge transfer of substantially conventional form. Again it is the punch-through charge introduction concept which enables this combination to be utilized. When reference is made herein to punch-through to the second layer-shaped part it is to be interpreted in a sufficiently broad sense when using an intrinsic photoconductor for the second layer-shaped part as to include both the case where the depletion region associated with the storage sites in the first layer-shaped part locally extends to a barrier between regions of opposite conductivity type at the heterojunction and the case where the depletion region locally extends to a barrier between regions of the same conductivity type at the heterojunction. Thus the term 'punch-through' when using an intrinsic photoconductor for the second layer-shaped part is to be construed in terms of the operational feature of a depletion region locally withdrawing free charge carriers, which form minority charge carriers in the material of the first layer-shaped part adjoining the heterojunction, from the intrinsic photoconductor adjacent the heterojunction. Such free charge carriers can become available on the basis of the absorption of radiation in the second layer-shaped part of an intrinsic photoconductive semiconductor material yielding electron-hole pairs. In the case where the material of the first layer-shaped part adjoining the heterojunction and in which a depletion region for enabling the local collection of charge carriers is formed is n-type there will be a local collection of free holes from the intrinsic photoconductor and when said material of the first layer-shaped part adjoining the heterojunction is p-type there will be a local collection of free electrons from the intrinsic photoconductor. When said charge carriers are of the kind which form majority charge carriers in the second layer-shaped part the number of carriers collected will be dependent upon the background flow of carriers in the second layer-shaped part plus those generated by radiation absorption. When said charge carriers are of the kind which would form minority charge carriers in the second layer-shaped part the number of carriers collected will be dependent substantially upon those generated by radiation absorption. In both cases there will be collection of carriers, forming minority charge carriers in the said adjoining material of the first layer-shaped part, which are thermally generated at the heterojunction. It is therefore desirable to provide a heterojunction having a low number of interface states.

In the said second form of an arrangement in accordance with the invention and comprising the intrinsic photoconductive semiconductor material the operation is also based upon the measurement of the instantaneous flux of the radiation incident locally on an elemental portion of the second layer-shaped part, said flux being integrated during the period at which the depletion region in the first layer-shaped part punches-through to the heterojunction.

A potential advantage of the said second form of an arrangement in accordance with the invention resides in that it is not necessary to operate at such low temperatures, for example for the detection and/or imaging of an infra-red radiation pattern in the wavelength band of between 8 microns and 14 microns the use of a conventional intrinsic photoconductive semiconductor material for the second layer-shaped part may permit operation at a temperature above 77° K., whereas using a second layer-shaped part of extrinsic semiconductor material for such detection and/or imaging normally necessitates operation below 77° K.

According to a further aspect of the invention there is provided a charge coupled device suitable for use in an arrangement in accordance with the invention of the said second form, comprising a body having a first layer-shaped part of semiconductor material having a charge transfer register and an adjoining second layer-shaped part of an intrinsic photoconductive semiconductor material which is contiguous with said first layer-shaped part and forms a heterojunction with said first layer-shaped part, the charge transfer register comprising a system of electrodes present adjacent the surface of the first layer-shaped part opposite and remote from the second layer-shaped part and provided for enabling transfer in the longitudinal direction of the first layer-shaped part of charge carriers characteristic of one conductivity type following their direct introduction from the second layer-shaped part into storage sites in the first layer-shaped part and associated with the charge transfer register, at least the portion of the first layer-shaped part adjoining the heterojunction being of the opposite conductivity type.

Such a device in common with the previously described second form of the arrangement has various advantageous features, in particular a device suitable for the detection and/or imaging of an infra-red radiation pattern can be constructed using substantially conventional technology and materials both for the charge transfer register and for the radiation detection and/or imaging, Furthermore provided the two materials are compatible a wide freedom of choice can exist for the material of the intrinsic photoconductive second layer-shaped part without imposing a restriction upon the material of the first layer-shaped part in which the charge transfer register is present provided the necessary heterojunction can be realized with a low number of surface states. The first layer-shaped part may be, for example of silicon.

In one form of the device comprising an intrinsic photoconductive second layer-shaped part the second layer-shaped part is of the opposite conductivity type. Thus in this form the heterojunction is a p-p or n-n heterojunction and the input of charge carriers from the second layer-shaped part will be dependent substantially on the instantaneous rate of generation by radiation of carriers of a kind which form minority charge carriers in said second layer-shaped part and not therefore depend on a background flow of majority charge carriers. In another form the intrinsic photoconductive second layer-shaped part is of the one conductivity type and thus the heterojunction is a p-n heterojunction.

The said devices comprising an intrinsic photoconductive second layer-shaped part may be constructed for operation either with surface transport or with bulk transport in the charge transfer register. In the former case the first layer-shaped part is of the said opposite conductivity type and the charge transfer register is constructed for operation with charge transport of charge carriers characteristic of the one conductivity type adjacent the said surface of the first layer-shaped part, the thickness and doping concentration of the first layer-shaped part being such as to enable local depletion region parts to be formed extending across the entire thickness of said part while avoiding breakdown.

When using silicon for the first layer-shaped part various possibilities exist for the second layer-shaped part depending on the desired application. Thus in one example in which the device is constructed for response to infra-red radiation in the wavelength band of 3 microns to 5 microns the first layer-shaped part is of n-type silicon and the second layer-shaped part is of n-type lead sulphide. In another form suitable for the same application the first layer-shaped part is of n-type silicon and the second layer-shaped part is of p-type lead telluride.

The intrinsic photoconductive semiconductor second layer-shaped part may be present as a deposited layer on the first layer-shaped part. In general the thickness of an intrinsic photoconductive second layer-shaped part can be significantly smaller than when using an extrinsic second layer-shaped part.

Figure 3:
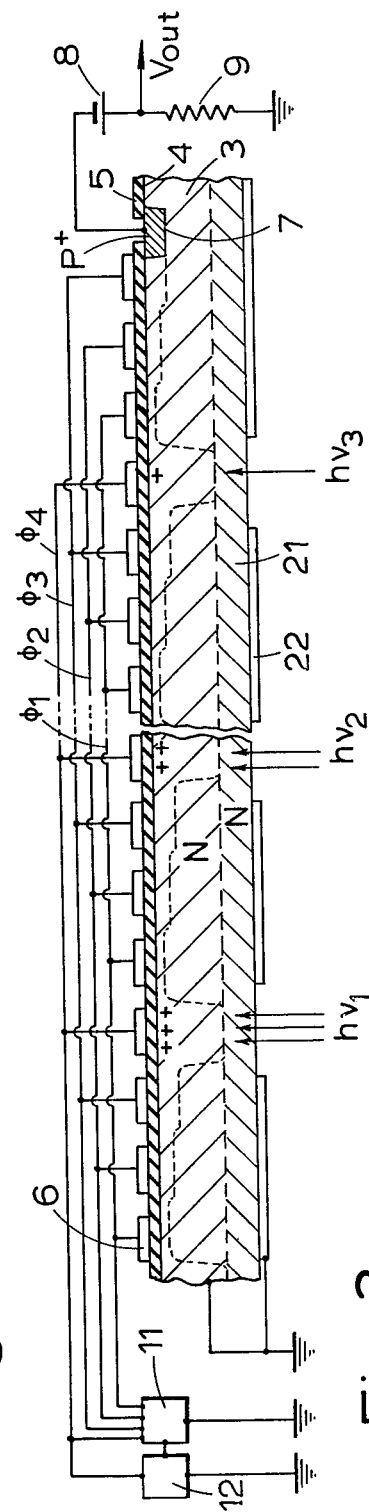
Figure 2:
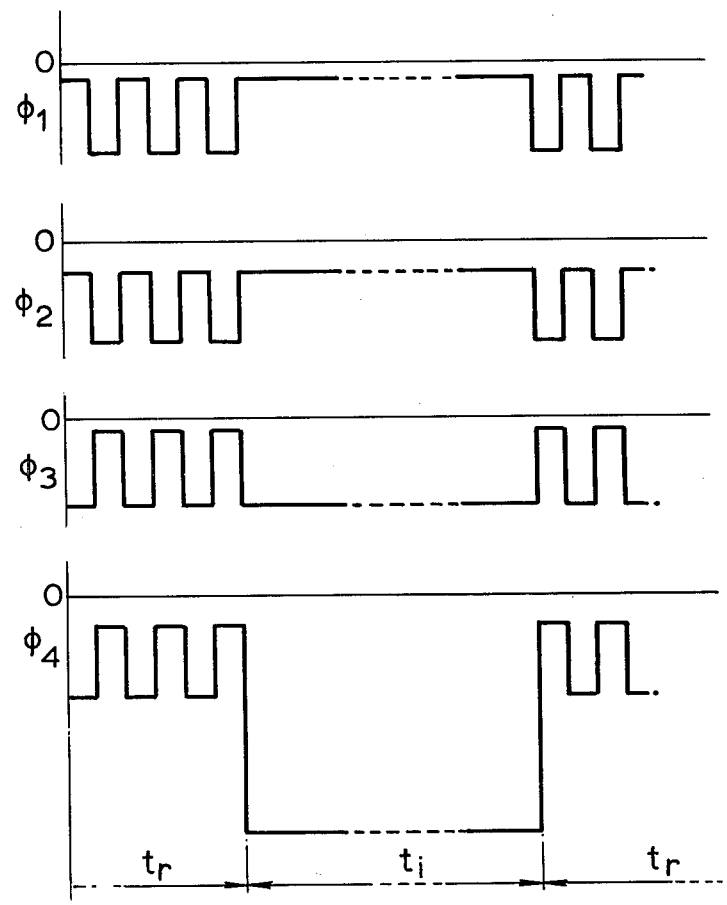
Figure 4:
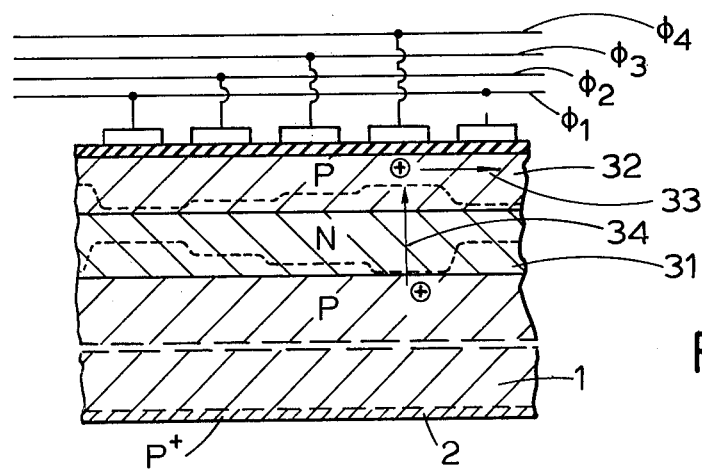

Embodiments of the invention will now be described, by way of example, with reference to the accompanying diagrammatic drawings, in which:

FIG. 1 shows a first embodiment of a charge coupled circuit arrangement in accordance with the invention and including in sectional view part of the semiconductor body of the charge coupled device included in said circuit, FIG. 2 shows in a diagrammatic form the waveforms of the clock voltages applied in the operation of a charge coupled circuit arrangement as shown in FIG. 1, FIG. 3 shows a second embodiment of a charge coupled circuit arrangement in accordance with the invention and including in sectional view part of the semiconductor body of the charge coupled device included in said circuit, and FIG. 4 shows part of a cross-sectional view of an embodiment of a charge coupled device suitable for use in an arrangement in accordance with the invention.

Referring now to FIG. 1 there is diagrammatically shown a charge coupled circuit arrangement for imaging an infra-red radiation pattern in the wavelength band of between 3 and 5 microns. The arrangement comprises a semiconductor body of which only part is shown in FIG. 1. For the sake of clarity of illustration FIG. 1 relates to a simplified form of embodiment in which the elemental imaging parts in the semiconductor body are in the form of a linear array. However within the scope of the invention there are also arrangements in which the elemental imaging parts are constructed as a two-dimensional array, this being a so-called area imager. The semiconductor body comprises a first layer-shaped part in which a charge transfer register is present and a second layer-shaped part in which free charge carriers can by yielded when said part is subjected to infra-red radiation in the said wavelength band.

The second layer-shaped part of the semiconductor body comprises a substrate 1 of extrinsically doped p-type silicon having a thickness of 200 microns. The substrate doping is of indium and has a concentration of $2 \times 10^{17}$ atoms cm$^{-3}$.

At the lower surface of the substrate 1 there is a low resistivity p$^+$-diffused region 2 forming a contact region to the p-type substrate. On the upper surface of the substrate there is present the first layer-shaped part comprising an n-type silicon epitaxial layer 3 of 5 microns thickness having a substantially uniform doping of phosphorus of $5 \times 10^{14}$ atoms cm$^{-3}$. On the surface 4 of the epitaxial layer 3 there is an insulating layer 5 of silicon oxide. On the surface of the insulating layer 5 there is a system of electrodes consisting of closely spaced aluminum layer parts 6 and provided for capacitively generating electric fields in the layer 3 by means of which pattern-representing information in the form of packets of minority charge carriers (holes) can be collected and sequentially transferred to read-out means. In this embodiment the read-out means consist of a p$^+$-diffused region 7 connected to ground via a D.C. bias source 8 and resistor 9, an output voltage $V_{out}$ indicative of the magnitude of charge packets as sequentially transferred to the output diffused region 7 being derivable at the position shown.

The electrodes 6 are connected in sequential groups of four via lines $\phi_1$, $\phi_2$, $\phi_3$, $\phi_4$ to a source 11 of four-phase clock voltages. The line $\phi_4$ is additionally connected to a further clock voltage source 12 which is synchronized with the source 11. The charge transfer action provided by the electrodes and four-phase clock voltage source 11 is substantially conventional. The additional source 12 is present for periodically providing a large negative voltage on the line $\phi_4$ during which periods the voltages on the lines $\phi_1$, $\phi_2$ and $\phi_3$ are maintained at significantly lower levels. The waveforms of the voltages on the lines $\phi_1$, $\phi_2$, $\phi_3$ and $\phi_4$ are shown in FIG. 2. For the charge transfer of minority carriers (holes) to the read-out stage after introduction into storage sites the clocking voltages on the lines $\phi_1$ and $\phi_3$ vary between $-2$ volts and $-6$ volts whereas the clocking voltages on the lines $\phi_2$ and $\phi_4$ during this part of the cycle vary between $-4$ volts and $-8$ volts. At the end of a read-out period indicated by $t_r$ in FIG. 2, the source 12 provides a voltage of $-20$ volts on the line $\phi_4$ while the lines $\phi_1$, $\phi_2$ and $\phi_3$ are maintained respectively at $-2$, $-4$ and $-6$ volts. The large negative voltage on the line $\phi_4$ is sufficient to cause the depletion region parts formed below those of the electrodes 6 connected to the line $\phi_4$ to extend completely across the layer 3 and punch-through to the p-n junction between the substrate 1 and layer 3. This condition, together with the application of the constant negative voltages on the line $\phi_1$, $\phi_2$ and $\phi_3$ is maintained for an integration period $t_i$, which may be, for example, in the region of 100 microseconds, when imaging with the arrangement shown in FIG. 1 an infra-red pattern in the wavelength band of 3 microns to 5 microns.

The semiconductor body is suitably constructed with respect to the intended direction of incidence of the radiation pattern. Normally the arrangement shown will be operated with the radiation pattern directed at the lower surface of the substrate, however, in a modification of this embodiment the structure could be suitably adapted to receive the radiation at the upper surface, in which case the electrode 6 is chosen to be of a material and thickness which will allow transmission of the infrared radiation.

At the temperature of operation of the arrangement, which is 60° K., in the substrate substantially all the levels provided by the indium impurities are filled with holes which can be released upon excitation by infra-red radiation in the wavelength band of 3 microns to 5 microns. An applied biasing source 14 is provided between a connection to the n-type layer 3 and a connection on the p$^+$-surface region 2 of the substrate, the direction of the biasing source being such that the junction between the layer 3 and substrate 1 may be reverse biased. This enables an alternative mode of operation to be effected in which the punch-through is controlled in accordance with the bias on said junction. Free holes released by the exciting infra-red radiation in those portions of the substrate directly below the electrodes connected to the line $\phi_4$ and in the vicinity of said portions and which drift towards the p-n junction are directly introduced into the layer 1 via the said depletion region parts formed in the layer 1 when they are in a state of punching-through to the p-n junction. Thus below any one of the electrodes 6 connected to the line $\phi_4$ free charge carriers in the form of holes will be introduced from the substrate 1 into the layer 3 via the punching-through depletion region part associated with said electrode. These holes will then, as minority charge carriers in the layer 3, be stored in a storage site adjacent the surface 4 below the associated electrode 6. During an integration period $t_i$ a quantity of holes will therefore be introduced into any one such storage site at a rate which is representative of the total instantaneous radiation incident upon the relevant portion of the substrate below the electrode connected to the line $\phi_4$ and having said storage site associated therewith. Thus, as an example, in FIG. 1 for the three storage sites shown the incident radiation on the portions of the substrate below said storage sites is shown as having three distinct values $hV_1 > hV_2 > hV_3$ and the quantity of holes introduced into the storage sites shown as +++, ++ and + respectively.

At the end of the integration period the voltage applied to the line $\phi_4$ is reduced to −8 volts, thus causing the depletion regions to retract from the p-n junction. Thereafter by a conventional four-phase charge transfer action the individual charge packets are transferred to the read-out means. The read-out period $t_r$ will be determined, inter alia, by the number of imaging bits of the linear array.

With the high photon flux occurring in the infra-red region of the spectrum the total frame period, that is $t_i + t_r$, can be relatively short, for example in the case of a 100 bit linear array the total frame period may be 150 microseconds of which the integration period is 100 microseconds. The actual frame period will be determined by a number of factors in any particular case, including the nature and concentration of the impurity doping in the substrate. The duration of the imaging integration part of the frame period is chosen in conjunction with the doping concentration of the substrate so that with infra-red radiation of maximum intensity incident throughout said period on any one elemental imaging portion of the substrate the charge packet size will be limited to $10^{12}$ holes per sq. cm.

A second embodiment of an arrangement will now be described with reference to FIG. 3 of the accompanying drawings. In this arrangement body parts and circuit components corresponding with those present in the first embodiment are indicated by the same reference numerals. The main difference resides in that in FIG. 3 the first layer-shaped part is an n-type semiconductor body part 3 of 10 microns thickness and formed as a thinned-down wafer having on the lower side thereof the second layer-shaped part which comprises a deposited layer 21 of an intrinsic photoconductor, in this case of n-type lead sulphide, having a thickness of 5 microns. On the lower surface of the layer 21 there is a metal ohmic contact layer 22 in the form of a matrix via the apertures of which infra-red radiation can pass. This arrangement is also designed for imaging an infra-red radiation pattern in the wavelength band of 3 microns to 5 microns, the radiation being incident as shown at the lower side of the layer 21. The control circuitry, including four-phase clocking voltage source 11 and associated source 12 is the same as that present in the previous embodiment. The read-out means are the same as in the previous embodiment but the contact layer 22 to the n-type lead sulphide layer 21 and the contact to the n-type layer 3 are in this embodiment maintained at the same potential. This arrangement is operated at 150° K. and due to the employment of an intrinsic photoconductive layer having for the given thickness a relatively high absorption a higher value of the detectivity $D^x$ factor may be obtained for the same value of the spatial resolution. Operation is based upon the infra-red radiation in the said wavelength band generating electron-hole pairs upon absorption in the second layer-shaped part of n-type lead sulphide. Those holes which are generated below the electrodes connected to the line $\phi_4$ and which diffuse or drift towards the junction will be collected by the depletion region parts produced below said electrodes which by their extension to the n-type layer are to be considered as in a punch-through condition.

Referring now to FIG. 4 there is shown in purely diagrammatic form a small cross-section of part of an embodiment of a charge coupled device in which the first and second layer-shaped parts are both of silicon and the charge transfer register in the first layer-shaped part is constructed for operation with the transfer of majority charge carriers via the interior of a region present in the first layer-shaped part. This device thus constitutes a modification of the device present in FIG. 1, corresponding parts and regions being indicated by the same reference numerals, the modification providing a bulk channel mode of transport of majority charge carriers compared with a surface adjoining channel mode of transport of minority charge carriers as present in the arrangement of FIG. 1. The p-type substrate 1 of extrinsic silicon together with the p$^+$-contact layer 2 are of the same material and dimensions as in the device present in FIG. 1. On the substrate 1 there is a double epitaxial silicon layer structure consisting of a first, n-type layer 31 and a second, p-type layer 32, each layer having a thickness of 5 microns. The doping of each layer is chosen such that it can be locally fully depleted without breakdown occurring. The p-type layer 32 is isolated from the surroundings by the surface insulating layer 5 and by an n$^+$-diffused region (not shown in the section of FIG. 4) which extends from said surface to the n-type layer 31, this n$^+$-region laterally bounding the region in the p-type layer 32 in which charge transport of holes is arranged to occur in a direction indicated by the arrow 33. The electrodes connected via the lines $\phi_1$, $\phi_2$, $\phi_3$ and $\phi_4$ to a source of four-phase clock voltages extend in a direction normal to the direction of charge transport substantially across the entire width of the p-type region bounded by the n$^+$-diffused region. The line $\phi_4$ is further connected to an additional source which is synchronized with the source of four-phase clock voltages and serves for maintaining a less positive voltage on the line $\phi_4$ when holding the voltages on the lines $\phi_1$, $\phi_2$ and $\phi_3$ at more positive predetermined levels. In operation the voltage levels on the lines $\phi_1$–$\phi_4$ and on the n-type layer 31 are such that with the potential applied to the p-type layer 32, for example via a read-out stage, the p-n junction between the layers 31 and 32 is in a reverse biased condition and the extent on the depletion region associated with this junction varies with the applied clock voltages. Thus during the normal charge transfer operation of holes via the interior of the p-type layer 32 in which operation those parts of the layer 32 below the electrodes in which information bearing charge packets are not present are fully depleted, the depletion region associated with the p-n junction between the layers 31 and 32 does not extend to the p-n junction between the substrate 1 and the layer 31. For the local introduction from the substrate 1 of radiation-excited free holes into storage sites in the p-type layer 32 situated below electrodes connected to the line $\phi_4$ the voltage on the line $\phi_4$ is made less positive so that the said depletion region locally punches through to the substrate 1 below the electrodes connected to the line $\phi_4$. This condition is shown for one such storage site in FIG. 4 and the introduction of holes into the storage site indicated by an arrow 34. Although it is possible to integrate the instantaneous radiation flux during the period of punch-through the amount of charge that can be introduced in any one storage site may not be so high as in an embodiment using a surface adjoining channel charge transfer register. For a full description of the mechanism by which the majority charge carriers (holes in the p-type layer 32) are transported via the interior of a layer to read-out means reference is invited to U.K. Pat. No. 1,414,183 which corresponds to U.S. application Ser. No. 866,004.

It will be appreciated that many modifications are possible within the scope of the present invention. Thus although the described embodiments are constructed for operation with four-phase clock voltages it is alternatively possible to construct devices for operation with, for example, two-phase or three-phase clock voltages.

The embodiment described in which the photodetections occur in an intrinsic photoconductive semiconductor material, namely the embodiment described with reference to FIG. 3, employs, by way of example, lead sulphide as the intrinsic photoconductive material. However other intrinsic photoconductive materials may be used, for example materials commonly employed in infra-red detectors, in accordance with their normal spectral sensitivity in order to detect and/or image a radiation pattern in a certain wavelength band. Furthermore the composition of some such materials will be further chosen in accordance with the desired spectral sensitivity. Radiation filters, in order to limit the incidence of radiation on the extrinsic or intrinsic photoconductive semiconductor body part to the desired wavelength band may be employed in a conventional form, for example as used in the infra-red detector art.

What is claimed is:

1. A charge coupled circuit arrangement for converting an electromagnetic radiation pattern in a certain wavelength band into electrical signals, comprising a body subjected to radiation in said wavelength band and having a first layer-shaped part of semiconductor material having a charge transfer register for transferring in the first layer-shaped part charge carriers representative of pattern information, an adjoining second layer-shaped part contiguous with said first layer-shaped part and comprising a photosensitive semiconductor material which yields free charge carriers when subjected to said radiation within said wavelength band, and circuit means connected to the device including means to cause locally at positions associated with selected storage sites in the first layer-shaped part the punch-through to the second layer-shaped part of a depletion region formed in the first layer-shaped part to cause the direct introduction of radiation-generated free charge carriers of polarity determinative of a single conductivity type from the second layer-shaped part into said storage sites in the first layer-shaped part, said storage sites being associated with the charge transfer register, the second layer-shaped part being of extrinsic semiconductor material of a first conductivity type and at least the adjoining portion of the first layer-shaped part being of a second conductivity type opposite to that of the first, the second layer-shaped part comprising an impurity concentration which yields at the temperature of operation impurity levels from which trapped charge carriers of polarity determinative of said first conductivity type can be released upon excitation by radiation in the said wavelength band, the first layer-shaped part comprising a region of the first conductivity type which is separated from the second layer-shaped part by a region of the second conductivity type, a rectifying junction being present between said regions of the first conductivity type and the second conductivity type, the charge transfer register being constructed for operation with charge transport of radiation-excited free charge carriers of polarity determinative of the first conductivity type via the bulk of the region of the first conductivity type and introduced into storage sites in the region of the first conductivity type via the local punch-through to the second layer-shaped part of a depletion region associated with said rectifying junction between the regions of the first and second conductivity types.

2. A charge coupled circuit arrangement as claimed in claim 1, wherein the first layer-shaped part and the second layer-shaped part are both of silicon.

3. A charge coupled circuit arrangement as claimed in claim 2, wherein the second layer-shaped part is of p-type silicon and said impurity concentration of the second layer-shaped part comprises at least one of the elements indium and thallium and provides a sensitivity to infra-red radiation in the wavelength band of between 3 microns and 5 microns.

4. A charge coupled circuit arrangement as claimed in claim 2, wherein the second layer-shaped part is of p-type silicon and said impurity concentration of the second layer-shaped part comprises gallium and provides a sensitivity to infra-red radiation in the wavelength band of between 8 microns and 14 microns.

5. A charge coupled circuit arrangement for converting an electromagnetic radiation pattern in a certain wavelength band into electrical signals, comprising a body subjected to radiation in said wavelength band and having a first layer-shaped part of semiconductor material having a charge transfer register for transferring in the first layer-shaped part charge carriers representative of pattern information, an adjoining second layer-shaped part contiguous with said first layer-shaped part and comprising a photosensitive semiconductor material which yields free charge carriers when subjected to said radiation within said wavelength band, and circuit means connected to the device including means to cause locally at positions associated with selected storage sites in the first layer-shaped part the punch-through to the second layer-shaped part of a depletion region formed in the first layer-shaped part to cause the direct introduction of radiation-generated free charge carriers of polarity determinative of a single conductivity type from the second layer-shaped part into said storage sites in the first layer-shaped part, said storage sites being associated with the charge transfer register, the second layer-shaped part being of extrinsic semiconductor material of a first conductivity type and at least the adjoining portion of the first layer-shaped part being of a second conductivity type opposite to that of the first, the second layer-shaped part comprising an impurity concentration which yields at the temperature of operation impurity levels from which trapped charge carriers of polarity determinative of said first conductivity type can be released upon excitation by radiation in the said wavelength band, said adjoining second layer-shaped part which is contiguous with said first layer-shaped part being of extrinsic semiconductor material of said first conductivity type and having an impurity concentration which yields impurity levels from which trapped charge carriers of polarity determinative of said first conductivity type can be released upon excitation by radiation in a selected wavelength band, the charge transfer register comprising a system of electrodes present adjacent the surface of the first layer-shaped part opposite and remote from the second layer-shaped part for causing the transfer in the longitudinal direction of the first layer-shaped part of charge carriers of polarity determinative of said first conductivity type following their direct introduction from the second layer-shaped part into storage sites in the first layer-shaped part and associated with the charge transfer register, at least the portion of the first layer-shaped part adjoining the second layer-shaped part being of said second conductivity type and forming a rectifying junction with the second layer-shaped part, introduction into storage sites in the first layer-shaped part of free charge carriers of polarity determinative of said first conductivity type released by radiation excitation in the second layer-shaped part being possible only via said rectifying junction and by the local punch-through of a depletion region formed at least in that portion of the first layer-shaped part which is of the second conductivity type, the first layer-shaped part comprising a region of the first conductivity type which is separated from the second layer-shaped part by a region of the opposite conductivity type, a rectifying junction being present between said regions of the first conductivity type and the second conductivity type, the charge transfer register being constructed for operation with charge transport of radiation-excited free charge carriers of polarity determinative of the first conductivity type via the bulk of the region of the first conductivity type, the thickness and doping concentration of the region of the first conductivity type being such as to cause the region locally to be fully depleted while avoiding breakdown and the thickness and doping concentration of the region of the second conductivity type being such as to cause said region locally to be fully depleted while avoiding breakdown.

6. A charge coupled device as claimed in claim 5, wherein the first layer-shaped part and the second layer-shaped part are both of silicon.

7. A charge coupled device as claimed in claim 6, wherein the second layer-shaped part is of p-type silicon and said impurity concentration of the second layer-shaped part comprises at least one of the elements indium and thallium and provides a sensitivity to infra-red radiation in the wavelength band of between 3 microns and 5 microns.

8. A charge coupled device as claimed in claim 6, wherein the second layer-shaped part is of p-type silicon and said impurity concentration of the second layer-shaped part comprises gallium and provides a sensitivity to infra-red radiation in the wavelength band of between 8 microns and 14 microns.

9. A charge coupled device as claimed in claim 5, wherein the first layer-shaped part comprises an epitaxial layer on a substrate comprising the second layer-shaped part.

10. A charge coupled circuit arrangement for converting an electromagnetic radiation pattern in a certain wavelength band into electrical signals, comprising a body capable of being subjected to radiation in said wavelength band and having a first layer-shaped part of semiconductor material having a charge transfer register for transferring in the first layer-shaped part charge carriers representative of pattern information, an adjoining second layer-shaped part contiguous with said first layer-shaped part and comprising a photosensitive semiconductor material which yields free charge carriers when subjected to radiation within said wavelength band, and circuit means connected to the device including means to cause locally at positions associated with selected storage sites in the first layer-shaped part the punch-through to the second layer-shaped part of a depletion region formed in the first layer-shaped part to cause the direct introduction of radiation-generated free charge carriers of polarity determinative of a single conductivity type from the second layer-shaped part into said storage sites in the first layer-shaped part, said storage sites being associated with the charge transfer register and the second layer-shaped part being of an intrinsic photoconductive semiconductor material having an energy band gap less than the photon energy of radiation within said wavelength band and forming a heterojunction with the semiconductor material of the first layer-shaped part.

11. A charge coupled device suitable for use in an arrangement as claimed in claim 10, wherein the second layer-shaped part of an intrinsic photoconductive semiconductor material which is contiguous with said first layer-shaped part forms a heterojunction with the first layer-shaped part, and the charge transfer register comprises a system of electrodes present adjacent the surface of the first layer-shaped part opposite and remote from the second layer-shaped part for causing the transfer in the longitudinal direction of the first layer-shaped part of charge carriers of polarity determinative of a first conductivity type following their direct introduction from the second layer-shaped part into storage sites in the first layer-shaped part and associated with the charge transfer register, at least the portion of the first layer-shaped part adjoining the heterojunction being of a second conductivity type opposite to that of the first type.

12. A charge coupled device as claimed in claim 11, wherein the second layer-shaped part is of the second conductivity type.

13. A charge coupled device as claimed in claim 12 wherein the first layer-shaped part is also of said second conductivity type and the charge transfer register is constructed for operation with charge transport of charge carriers of polarity determinative of the first conductivity type adjacent the surface of the first layer-shaped part, the thickness and doping concentration of the first layer-shaped part being such as to cause local depletion region parts to be formed extending across the entire thickness of said part while avoiding breakdown.

14. A charge coupled device as claimed in claim 13, wherein the first layer-shaped part is of silicon.

15. A charge coupled device as claimed in claim 14, wherein the first layer-shaped part is of n-type silicon and the second layer-shaped part is of n-type lead sulphide.

* * * * *